(12) United States Patent
Terrovitis

(10) Patent No.: US 8,536,915 B1
(45) Date of Patent: Sep. 17, 2013

(54) LOW-NOISE AND LOW-REFERENCE SPUR FREQUENCY MULTIPLYING DELAY LOCK-LOOP

(71) Applicant: Qualcomm Incorporated, San Diego, CA (US)

(72) Inventor: Emmanouil Terrovitis, Foster City, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/651,280

(22) Filed: Oct. 12, 2012

Related U.S. Application Data

(60) Provisional application No. 61/667,105, filed on Jul. 2, 2012.

(51) Int. Cl.
*H03L 7/06* (2006.01)

(52) U.S. Cl.
USPC ............................ 327/158; 327/147

(58) Field of Classification Search
USPC .................................. 327/149, 158
See application file for complete search history.

(56) References Cited

U.S. PATENT DOCUMENTS

| | | | |
|---|---|---|---|
| 6,330,296 B1 | 12/2001 | Atallah et al. | |
| 7,339,438 B2 | 3/2008 | Sohn | |
| 7,977,984 B1 | 7/2011 | D'Souza et al. | |
| 8,232,822 B2 | 7/2012 | Tsai | |
| 8,432,198 B2* | 4/2013 | Liang et al. | 327/156 |
| 2005/0046452 A1* | 3/2005 | Briones | 327/156 |
| 2005/0184772 A1* | 8/2005 | Wilson et al. | 327/156 |
| 2010/0225368 A1 | 9/2010 | Lu et al. | |
| 2010/0277408 A1* | 11/2010 | Willaert et al. | 345/102 |
| 2011/0199137 A1* | 8/2011 | Nagaraj et al. | 327/157 |
| 2011/0260762 A1* | 10/2011 | Choi et al. | 327/156 |

OTHER PUBLICATIONS

Gierkink, S., "An 800MHz-122dBc/Hz-at-200kHz Clock Multiplier based on a Combination of PLL and Recirculating DLL," ISSCC 2008, Session 25, Building Blocks for High-Speed Transceivers, pp. 453-455.

Farjad-Rad, et al, "A Low-power Multiplying DLL for Low-Jitter Multigigahertz Clock Generation in Highly Integrated Digital Chips", (2002) IEEE Journal of Solid State Circuits, vol. 37, No. 12, pp. 1804-1812.

Gierkink, et al, "Low-Spur, Low-Phase-Noise Clock Multiplier Based on a Combination of PLL and Recirculating DLL with Dual-Pulse Ring Oscillator and Self-Correcting Charge Pump", (2008) IEEE Journal of Solid-State Circuits, vol. 43, No. 12, pp. 2967-2976.

* cited by examiner

*Primary Examiner* — Adam Houston
(74) *Attorney, Agent, or Firm* — Mahamedi Paradice Kreisman LLP

(57) ABSTRACT

A delay-locked loop (DLL) circuit is disclosed that can generate an output oscillation signal having a frequency that is an integer multiple of an input oscillation signal. The DLL includes a phase detector, a charge pump, and a voltage-controlled oscillator (VCO). The phase detector generates UP and DN control signals in response to a phase difference between a reference signal and a feedback signal. The charge pump generates a control voltage in response to the UP and DN control signals. The VCO adjusts the frequency of the output oscillation signal in response to the control voltage, generates the reference signal in response to the input oscillation signal, and generates the feedback signal in response to the output oscillation signal.

37 Claims, 12 Drawing Sheets

LOW-NOISE AND LOW-REFERENCE SPUR FREQUENCY MULTIPLYING DELAY LOCK-LOOP

CROSS-REFERENCE TO RELATED APPLICATIONS

This application claims the benefit under 35 USC 119(e) of the and commonly owned U.S. Provisional Application No. 61/667,105 entitled "FREQUENCY MULTIPLYING DELAY-LOCKED LOOP WITH LOW NOISE AND LOW REFERENCE SPUR" filed on Jul. 2, 2012, the entirety of which is incorporated by reference herein.

TECHNICAL FIELD

The present embodiments relate generally to delay locked loops, and specifically to delay locked loops having frequency multipliers.

BACKGROUND OF RELATED ART

Phase-locked loops (PLLs) and delay-locked loops (DLLs) may be used to perform tasks such as de-skewing clock signals, recovering clock signals, synthesizing clock frequencies, and implementing clock distribution networks. PLLs typically employ a variable-frequency circuit such as a voltage-controlled oscillator (VCO) to lock an output signal to a reference signal, while DLLs typically employ a variable-delay circuit such as a voltage-controlled delay line to lock an output signal to an input signal.

More specifically, a PLL typically includes a phase detector and a voltage-controlled oscillator (VCO). The VCO, which includes an input to receive a control voltage and an output to generate an oscillation output signal, adjusts the frequency of the oscillation output signal in response to the control voltage. The control voltage, which is generated by the phase detector and other loop components (such as a charge pump and a filter), settles to a value that makes the VCO oscillate at the desired frequency. Additionally, the phase error at the output of the phase detector approaches zero. Thus, during operation, the loop adjusts the control voltage such that, in steady state, the VCO oscillates at the desirable frequency and the phase of the output clock has a specific relation with the phase of the reference clock.

A DLL typically includes a phase detector and a voltage-controlled delay line. The loop adjusts the control voltage such that the delay line provides a desired delay (and the phase error at the output of the phase detector is zero). The voltage-controlled delay line, which has inputs to receive the control voltage and the input signal, selectively delays the output signal until the output signal is delay-locked with the input signal. DLLs may be desirable over PLLs for multiplying a clock frequency by an integer value because, for example, DLLs typically provide more stability, employ smaller loop filters, and exhibit lower phase noise than PLLs.

FIG. 1 shows a conventional DLL circuit 100 that delay locks an output clock signal CLK_OUT with an input clock signal CLK_IN. More specifically, DLL circuit 100 includes a phase and frequency detector (PFD) 110, a charge pump 120, a loop filter 130, and a voltage-controlled delay line 140. A crystal oscillator may generate the oscillating clock signal CLK_IN to first inputs of the PFD 110 and the delay line 140. PFD 110 compares the phase of CLK_IN and a feedback signal CLK_FB to generate up (UP) and down (DN) control signals that are converted to a charge ($Q_C$) proportional to the phase difference of the two clocks by charge pump 120. The charge generated by the charge pump is filtered (e.g., integrated) by filter 130 and provided as a control voltage $V_C$ to delay line 140. The delay line 140, which includes a number (n) of series-connected delay elements 141 that provide a corresponding number of delay taps T1-Tn, selectively delays CLK_IN in response to $V_C$ to generate CLK_OUT. In this manner, the output signal CLK_OUT, which is provided as the feedback signal CLK_FB to PFD 110, may be synchronized (e.g., delay-locked) with the input signal CLK_IN by adjusting the signal delay within delay line 140 until the period of CLK_OUT equals the period of CLK_IN.

The delay taps T1-Tn provide a plurality of phase delays (e.g., $\phi_1, \phi_2, \ldots \phi_n$) of the clock signal. As such, the DLL 100 of FIG. 1 may be used as a frequency synthesizer by performing logic operations on the multiple clock phases at taps T1-Tn to achieve frequency multiplication of the input signal CLK_IN. Unfortunately, performing logic operations on the multiple clock phases provided by taps T1-Tn may introduce unwanted delays, which in turn may undesirably generate spurs in the output clock signal. Another disadvantage of DLL 100 being used as a frequency multiplier is that programmability of the multiplying factor is difficult to implement.

Accordingly, there is a need to provide a frequency multiplying DLL that can multiply a reference frequency by an arbitrary integer value while minimizing noise and spurs in the output clock signal.

SUMMARY

A delay-locked loop (DLL) is disclosed that can generate an output oscillation signal having a frequency that is an integer multiple of the frequency of an input oscillation signal. In accordance with the present embodiments, the DLL includes a phase detector, a charge pump, and a voltage-controlled oscillator (VCO). The phase detector, which includes inputs to receive a reference signal and a feedback signal, generates UP and DN control signals in response to a phase difference between the reference signal and the feedback signal. The charge pump, which is coupled to the phase detector, generates a control voltage in response to the UP and DN control signals. The VCO, which includes an input for signaling to the VCO to begin oscillation and an input to receive the control voltage, generates the output oscillation signal, the reference signal, and the feedback signal.

More specifically, the phase detector may compare phases of the reference signal and the feedback signal to generate the UP and DN control signals, which in turn may be used by the charge pump to adjust the control voltage. The VCO adjusts the frequency of the output oscillation signal in response to the control voltage. In accordance with the present embodiments, phase differences between the reference signal and the feedback signal may be indicative of phase differences between the input and output oscillation signals. Thus, adjusting the control voltage until the phase difference between the reference and feedback signals approaches zero may align selected edges of the output oscillation signal with selected edges of the input oscillation signal. In this manner, the frequency of the output oscillation signal may be maintained at a predetermined integer multiple of the frequency of the input oscillation signal without using any tap-controlled delay lines.

For some embodiments, the VCO includes an oscillator circuit, synchronization logic and a control circuit. The oscillator circuit generates the output oscillation signal, and includes a node to generate an internal oscillation signal. The synchronization logic, which includes inputs to receive the internal oscillation signal, the input oscillation signal, and a synchronization signal, generates the reference and feedback signals, and selectively forwards either the internal oscillation signal or the input oscillation signal as the output oscillation signal in response to the synchronization signal. The control circuit, which includes an input to receive the output oscillation signal, asserts the synchronization signal in response to detection of a predetermined number of cycles of the output oscillation signal.

More specifically, during a normal mode of oscillation (which may be associated with de-assertion of the synchronization signal), the synchronization logic forwards the internal oscillation signal as the output oscillation signal, and de-asserts the reference and feedback signals. In this mode, the VCO generates the output oscillation signal having a frequency that is an integer multiple of the frequency of the input oscillation signal. During a synchronization mode of operation (which may be associated with assertion of the synchronization signal), the synchronization logic forwards the input oscillation signal as the output oscillation signal, and asserts the reference and feedback signals. During this time, the synchronization logic generates the signals used by the phase detector and charge pump to selectively adjust the frequency of the output oscillation signal (e.g., by adjusting the control voltage) until the selected edges of the output oscillation signal are aligned with selected edges of the input oscillation signal.

As described herein, DLLs in accordance with the present embodiments may be advantageous over conventional DLLs for several reasons. First, by employing a VCO to control the oscillation frequency of the DLL output signal, DLLs in accordance with the present embodiments may reduce circuit area compared to conventional DLLs that employ tap-controlled delay lines. Indeed, tap-controlled delay lines typically occupy a large amount of area. Each tap, which may include one or more buffers or inverters, has a fixed area, and the number of taps needed depends on the maximum delay required. For example, in a clock management circuit, the maximum delay is dictated by the lowest frequency to be supported. Thus, the design of a tap-controlled delay line requires a tradeoff between layout area and the supported frequency range.

Second, by employing a VCO instead of tap-controlled delay lines, DLLs of the present embodiments may generate output oscillation signals having minimal distortion and duty cycle error. For example, differences between the rise and fall times of the delay taps in a delay line may cause undesirable variations in the duty cycle of the output signal. Indeed, for applications in which the input signal has a high frequency, duty cycle distortion of a tap-controlled delay-line may cause the clock pulse to disappear entirely. In contrast, DLLs of the present embodiments do not suffer from such duty cycle distortions, for example, because the VCO periodically synchronizes the output oscillation signal with the input oscillation signal without the use of tap-controlled delay lines.

BRIEF DESCRIPTION OF THE DRAWINGS

The present embodiments are illustrated by way of example and are not intended to be limited by the figures of the accompanying drawings, where.

Like reference numerals refer to corresponding parts throughout the drawing figures.

DETAILED DESCRIPTION

In the following description, numerous specific details are set forth to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. Further, for at least some embodiments, the input oscillation signal and the output oscillation signal may be an input clock signal and an output clock signal, respectively.

Figure 2:
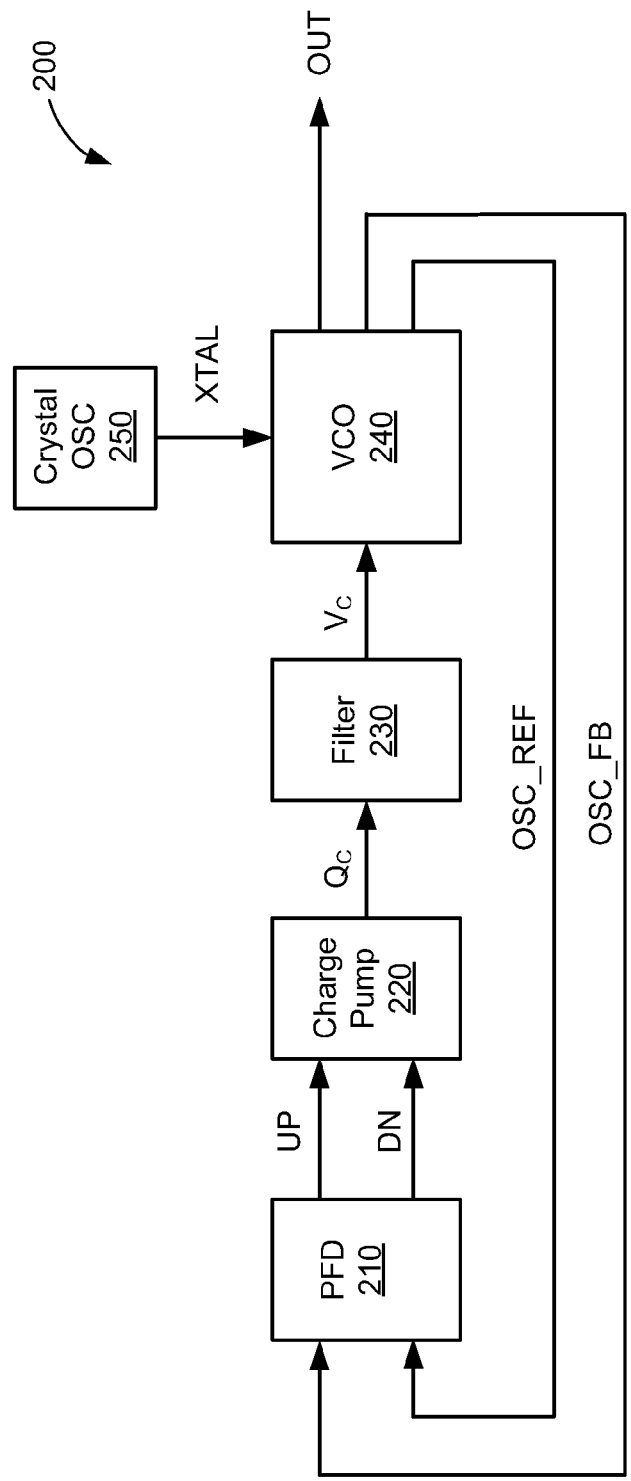
FIG. 2 is a block diagram of a DLL in accordance with some embodiments.

FIG. 2 is a block diagram of a delay-locked loop (DLL) circuit 200 in accordance with the present embodiments. As described below, DLL circuit 200 may be used for frequency multiplication, and therefore embodiments of DLL circuit 200 may be referred to herein as frequency multiplying DLLs. As depicted in FIG. 2, DLL circuit 200 includes a phase and frequency detector (PFD) 210, a charge pump 220, a loop filter 230, and a voltage-controlled oscillator (VCO) 240. The PFD 210 includes inputs to receive a reference oscillation signal (OSC_REF) and a feedback oscillation signal (OSC_FB), and includes outputs to generate UP and DN control signals. Charge pump 220 includes inputs to receive the UP and DN control signals, and includes an output to generate a charge $Q_C$. Loop filter 230, which filters (e.g., integrates) the charge produced by the charge pump to generate control voltage $V_C$ for the VCO 240, may be any suitable loop filter. The VCO 240 includes a first input to receive an input oscillation signal (XTAL) provided by a crystal oscillator 250, a second input to receive the control voltage $V_C$, a first output to generate an output oscillation signal (OUT), a second output to generate the oscillation reference signal OSC_REF, and a third output to generate the oscillation feedback signal OSC_FB.

Although the input signal XTAL is depicted in FIG. 2 as generated by crystal oscillator 250, for other embodiments, the input signal XTAL may be generated by other components, such as another suitable oscillator or a clock circuit.

Figure 1:
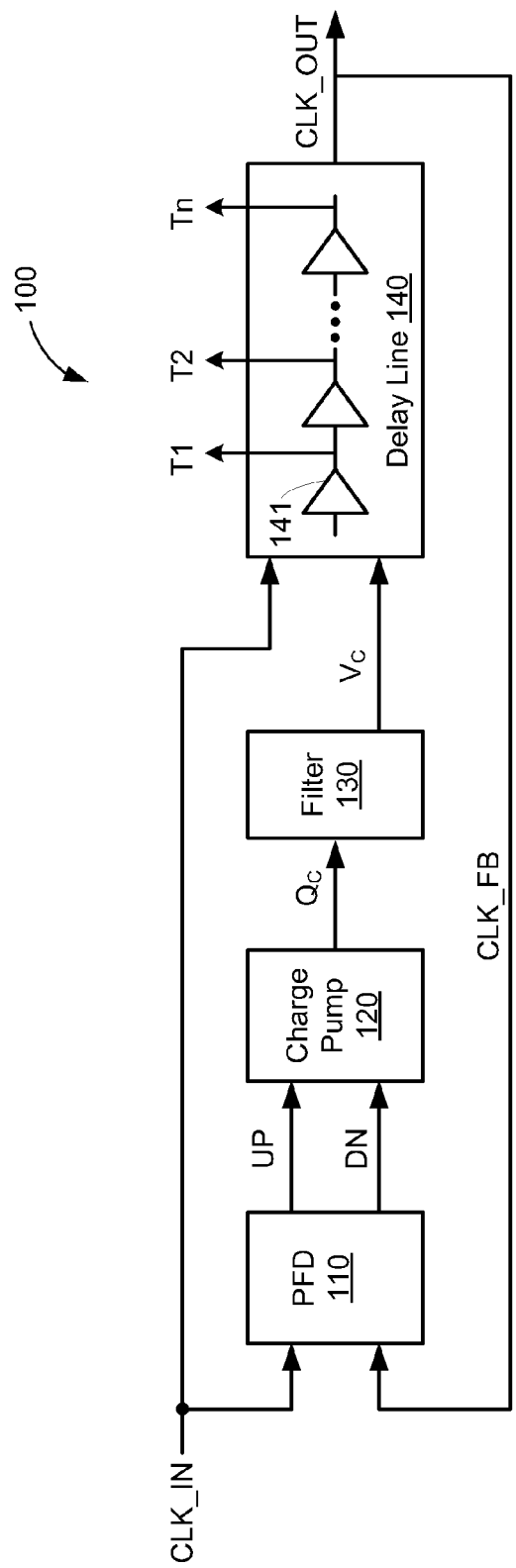
FIG. 1 is a block diagram of a conventional DLL.

In accordance with present embodiments, the VCO 240 may provide delay functions implemented using voltage-controlled delay lines (such as delay line 140 of FIG. 1). Further, during operation of DLL circuit 200, a single clock edge (e.g., originating from a rising edge of the input signal XTAL) may circulate through a loop formed within VCO 240 to generate the oscillation output signal OUT provided at the first output of VCO 240, thereby allowing the VCO 240 to operate as an infinite, folded, voltage-controlled delay line. The frequency of the output signal OUT, which may be adjusted in response to the control voltage $V_C$, may be an integer multiple of the frequency of the input signal XTAL. Thus, as described in more detail below, the input signal XTAL may be used by the VCO 240 to reset the edge circulating through the loop within VCO 240 (e.g., to re-align the phase of the output signal OUT with the phase of the input signal XTAL).

For some embodiments, VCO 240 may be formed using a latch (e.g., a set-reset (SR) latch), two delay elements, a synchronization logic and a control circuit. For such embodiments, a selected clock edge (e.g., a positive edge or a negative edge) circulates through the SR latch and two delay elements such that after one of the delay elements propagates a positive edge, the SR latch resets the input of that delay element to zero. In this manner, a single clock edge circulating through VCO 240 may generate the output signal OUT, which as mentioned above may be configured to have a frequency that is an integer multiple of the frequency of the input signal XTAL.

The synchronization logic (not shown in FIG. 2 for simplicity) may track and synchronize the phase of the output signal OUT with the phase of the input signal XTAL. The control circuit may generate a synchronization signal (EXP_EDGE, not shown) that, in turn, may be used by the synchronization logic to generate the reference and feedback signals OSC_REF and OSC_FB. As mentioned above, the phases of the reference and feedback signals OSC_REF and OSC_FB are compared in the PFD 210 to generate the control voltage $V_C$ for VCO 240, and therefore timing differences between the assertion of OSC_REF and OSC_FB by the VCO 240 may be indicative of a phase difference between the output oscillation signal OUT and the input oscillation signal XTAL. For some embodiments, the reference signal OSC_REF may be generated by logically ANDing the input signal XTAL with a synchronization signal (EXP_EDGE), and the feedback signal OSC_FB may be generated by logically ANDing the output signal OUT with the control signal EXP_EDGE.

Further, for some embodiments, the VCO 240's control circuit may include or be associated with a counter (not shown in FIG. 2 for simplicity) that counts how many times a selected clock edge circulates through the loop within VCO 240. For some embodiments, after the counter value reaches a predetermined count threshold, the control circuit may assert the synchronization signal EXP_EDGE. Assertion of EXP_EDGE may cause an edge of input signal XTAL to be forwarded to the output (to form signal OUT). The two delay elements within the VCO 240 may stop circulating the clock edge from the previous cycle, thereby allowing the VCO 240 to provide a finite length delay line. In addition, the new XTAL edge will start circulating between the two VCO delays. The predetermined count threshold may indicate an integer value for multiplying the frequency of the input signal XTAL to generate the output signal OUT.

Figure 3A:
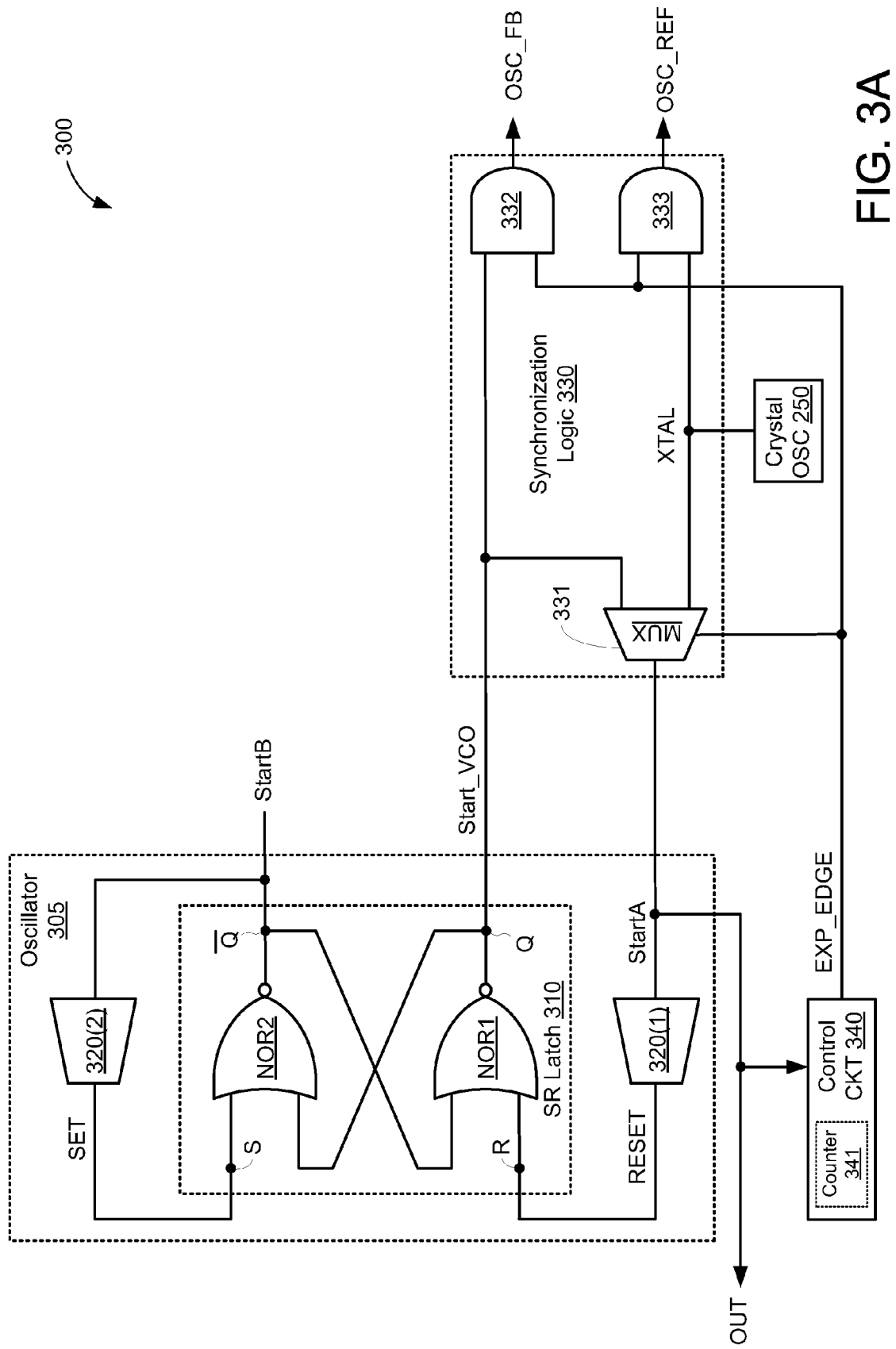
FIG. 3A is a block diagram of one embodiment of an VCO circuit that, in accordance with some embodiments, may be employed in the DLL circuit of FIG. 2.

FIG. 3A illustrates a VCO 300 that is one embodiment of VCO 240 of FIG. 2. The VCO 300, which can be periodically reset by selected edges of the input signal XTAL (FIG. 2), includes an SR latch 310, two delay elements 320(1)-320(2), synchronization logic 330, and a control circuit 340. The SR latch 310, which is formed by two cross-coupled NOR gates NOR1 and NOR2, includes a Reset input (R), a Set input (S), a first output (Q), and a second output ($\overline{Q}$). For purposes of discussion herein, the signal provided to the input of first delay element 320(1) may be referred to as a first start signal (StartA), the signal generated at the Q output of SR latch 310 may be referred to as an internal VCO start signal (Start_VCO), and the signal generated at the $\overline{Q}$ output of SR latch 310 may be referred to as a second start signal (StartB).

The first delay element 320(1) has an input to receive either the internal signal Start_VCO from the Q output of SR latch 310 or the input signal XTAL via synchronization logic 330, and has an output coupled to the Reset input of SR latch 310. The second delay element 320(2) has an input coupled to the $\overline{Q}$ output of SR latch 310, and has an output coupled to the Set input of SR latch 310. Together, SR latch 310 and the two delay elements 320(1)-320(2) form an oscillator circuit 305 of VCO 300.

As depicted in FIG. 3A, first delay element 320(1) provides the RESET signal for SR latch 310, and second delay element 320(2) provides the SET signal for SR latch 310. Thus, for some embodiments, assertion of the RESET signal (e.g., to logic high) by first delay element 320(1) causes SR latch 310 to drive its Q output to logic low and drive its $\overline{Q}$ output to logic high, while assertion of the SET signal (e.g., to logic high) by second delay element 320(2) causes SR latch 310 to drive its Q output to logic high and drive its $\overline{Q}$ output to logic low. In this manner, a selected clock edge (e.g., a positive edge) may circulate through oscillator circuit 305 and cause the output signal OUT to oscillate between logic low and high states. The oscillation frequency of the output signal OUT may be determined, at least in part, by the signal delay introduced by first and second delay elements 320(1) and 320(2). For some embodiments, the signal delay provided by first and second delay elements 320(1) and 320(2) may be changed by adjusting the control voltage $V_C$.

For some embodiments, each of delay elements 320(1) and 320(2) may be configured to propagate logic high signals from its input terminal to its output terminal after an externally-adjustable predetermined delay period indicative of the frequency of the oscillation signal, and may be configured to propagate logic low signals from its input terminal to its output terminal after a small gate delay that may have a negligible effect upon the oscillation frequency. In this manner, VCO 300 may be configured to propagate a positive or rising edge of the start signal through SR latch 310 and delay elements 320(1)-320(2) in a manner that produces an oscillation signal at the Q output of SR latch 310.

More specifically, in response to receiving a rising edge of signal StartA, first delay element 320(1) asserts its output signal RESET to logic high after a predetermined delay period D1 associated with first delay element 320(1). Similarly, in response to receiving a rising edge of signal StartB, second delay element 320(2) asserts its output signal SET to logic high after a predetermined delay period D2 associated with second delay element 320(2). For one or more embodiments, upon receiving a falling edge of signal StartA, first delay element 320(1) quickly de-asserts its output signal RESET to logic low (e.g., more quickly than asserting output signal RESET to logic high in response to a rising edge of StartA), and upon receiving a falling edge of signal StartB, second delay element 320(2) quickly de-asserts its output signal SET to logic low (e.g., more quickly than asserting output signal SET to logic high in response to a rising edge of StartB).

The synchronization logic 330 includes a symmetric multiplexer (MUX) 331 and two logical AND gates 332-333. MUX 331 has a first input coupled to the Q output of SR latch 310 to receive signal Start_VCO, has a second input coupled to crystal oscillator 250 to receive the input signal XTAL, has a control terminal coupled to control circuit 340 to receive the synchronization signal EXP_EDGE, and has an output to provide the signal StartA to the input of first delay element 320(1). Thus, MUX 331 selectively forwards either XTAL or Start_VCO as the signal StartA to first delay element 320(1) in response to EXP_EDGE.

For exemplary embodiments described herein, when EXP_EDGE is de-asserted to logic low, MUX 331 forwards Start_VCO as StartA to first delay element 320(1), thereby allowing SR latch 310 and delay elements 320(1)-320(2) to operate as an oscillator independently of the input signal XTAL. Conversely, when EXP_EDGE is asserted to logic high, MUX 331 forwards XTAL as StartA to first delay element 320(1), thereby allowing the input signal XTAL to reset the clock edge circulating through the oscillator circuit 305 and/or allowing the output signal OUT to be synchronized with the input signal XTAL.

AND gate 332 has a first input coupled to the Q output of SR latch 310 to receive signal Start_VCO, has a second input coupled to control circuit 340 to receive the control signal EXP_EDGE, and has an output to generate the feedback signal OSC_FB. In operation, when EXP_EDGE is asserted to logic high, AND gate 332 passes the signal Start_VCO as OSC_FB to PFD 210 of the DLL circuit 200 of FIG. 2. Conversely, when EXP_EDGE is de-asserted to logic low, AND gate 332 forces OSC_FB to logic low, irrespective of the logic state and/or logic transitions of the signal Start_VCO. In one embodiment, the PFD 210 is sensitive to the rising edge of its input signals. Since the oscillator 305 oscillates at a frequency multiple of the crystal clock period, multiple positive edges of Start_VCO signal are generated in a crystal clock period. Hence, in one embodiment, ANDing Start_VCO with EXP_EDGE causes the appropriate positive edge of Start_VCO to be used as the feedback signal of the loop OSC_FB.

AND gate 333 has a first input coupled to crystal oscillator 250 to receive the input signal XTAL, has a second input coupled to control circuit 340 to receive the control signal EXP_EDGE, and has an output to generate the reference signal OSC_REF. In operation, when EXP_EDGE is asserted to logic high, AND gate 333 passes the input signal XTAL as OSC_REF to PFD 210 of the DLL circuit 200 of FIG. 2. Conversely, when EXP_EDGE is de-asserted to logic low, AND gate 333 forces OSC_REF to logic low, irrespective of the logic state and/or logic transitions of the input signal XTAL. In one embodiment, since there is only one XTAL rising edge in the crystal clock period, gate 333 is not needed to perform a selection (unlike for gate 332). However, gate 333 is used such that (i) signals Start_VCO and XTAL (as well as OSC_FB and OSC_REF) are treated identically and (ii) delays in the two paths are equalized. In another embodiment, the input of gate 333 (shown as connected to EXP_EDGE) can be connected to logic high (e.g., permanently connected to a voltage source).

Thus, when EXP_EDGE is asserted to logic high, AND gates 332 and 333 pass signals Start_VCO and XTAL as respective signals OSC_FB and OSC_REF to the PFD 210 of FIG. 2, thereby allowing the PFD 210 to compare the phase of Start_VCO with the phase of the input signal XTAL to generate the UP and DN signals used by charge pump 220 to generate the control voltage $V_C$. For purposes of discussion herein, assertion of EXP_EDGE causes DLL circuit 200 to enter a synchronization mode during which (i) the signals OSC_REF and OSC_FB (which are used for phase adjustment) are generated, (ii) an edge circulating between the delays of the oscillator since the previous reference cycle is terminated, and (iii) a new edge from the XTAL signal is introduced to the oscillator.

As mentioned above, control circuit 340 generates the synchronization signal EXP_EDGE. For exemplary embodiments of FIG. 3A, control circuit 340 includes (or may be otherwise associated with) a counter 341 having an input to receive the signal StartA. In operation, counter 341 counts the number of selected (e.g., positive) edges of the signal StartA. When the count value reaches a predetermined threshold value, counter 341 may assert a trigger signal that causes control circuit 340 to toggle the logic state of the control signal EXP_EDGE. In this manner, the predetermined threshold value may be used to provide an integer value for multiplying the frequency of the input signal XTAL when generating the output signal OUT.

Figure 6A:
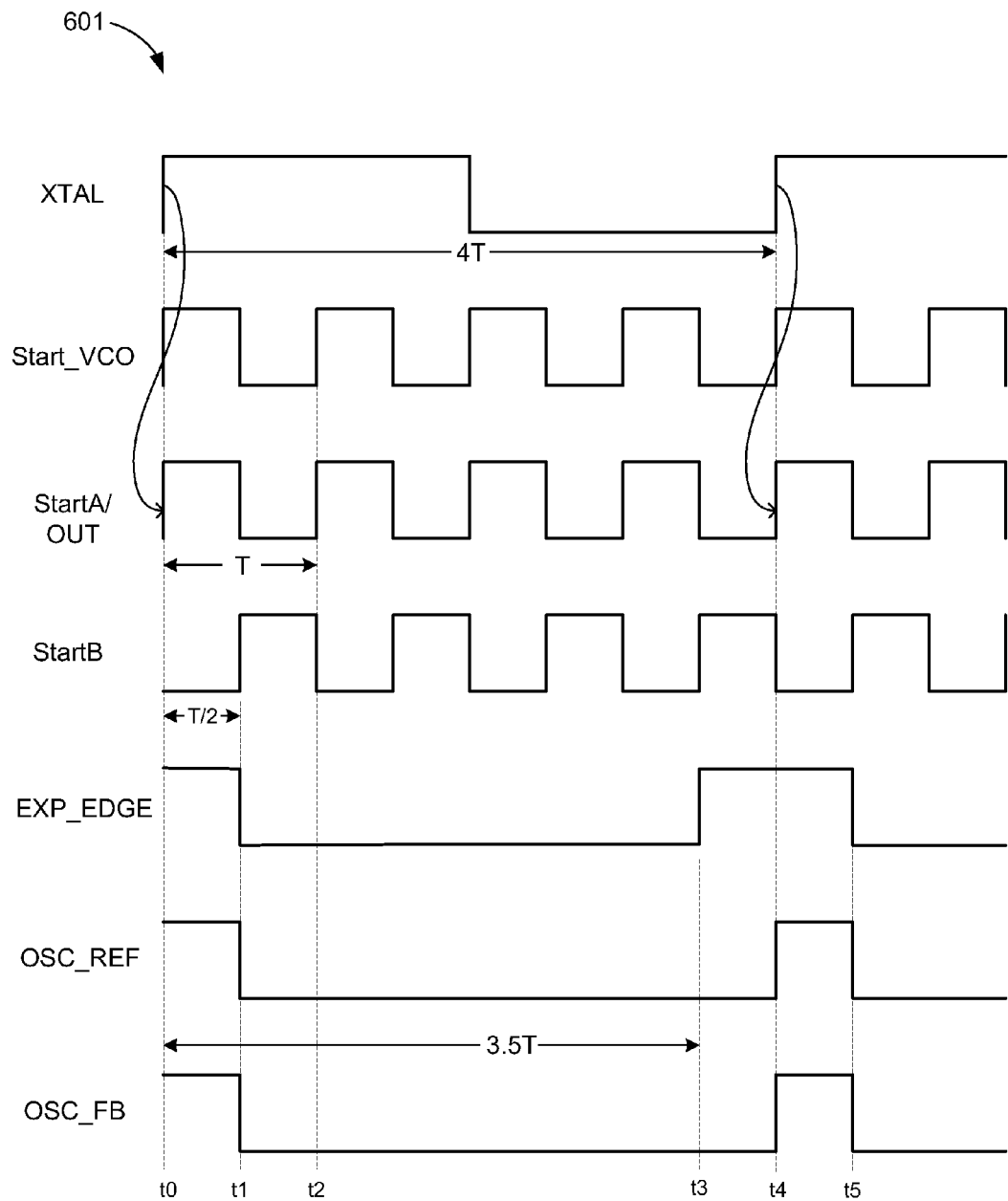
FIG. 6A is a waveform diagram illustrating an exemplary operation of the DLL circuit of FIG. 2 in accordance with some embodiments.
Figure 6B:
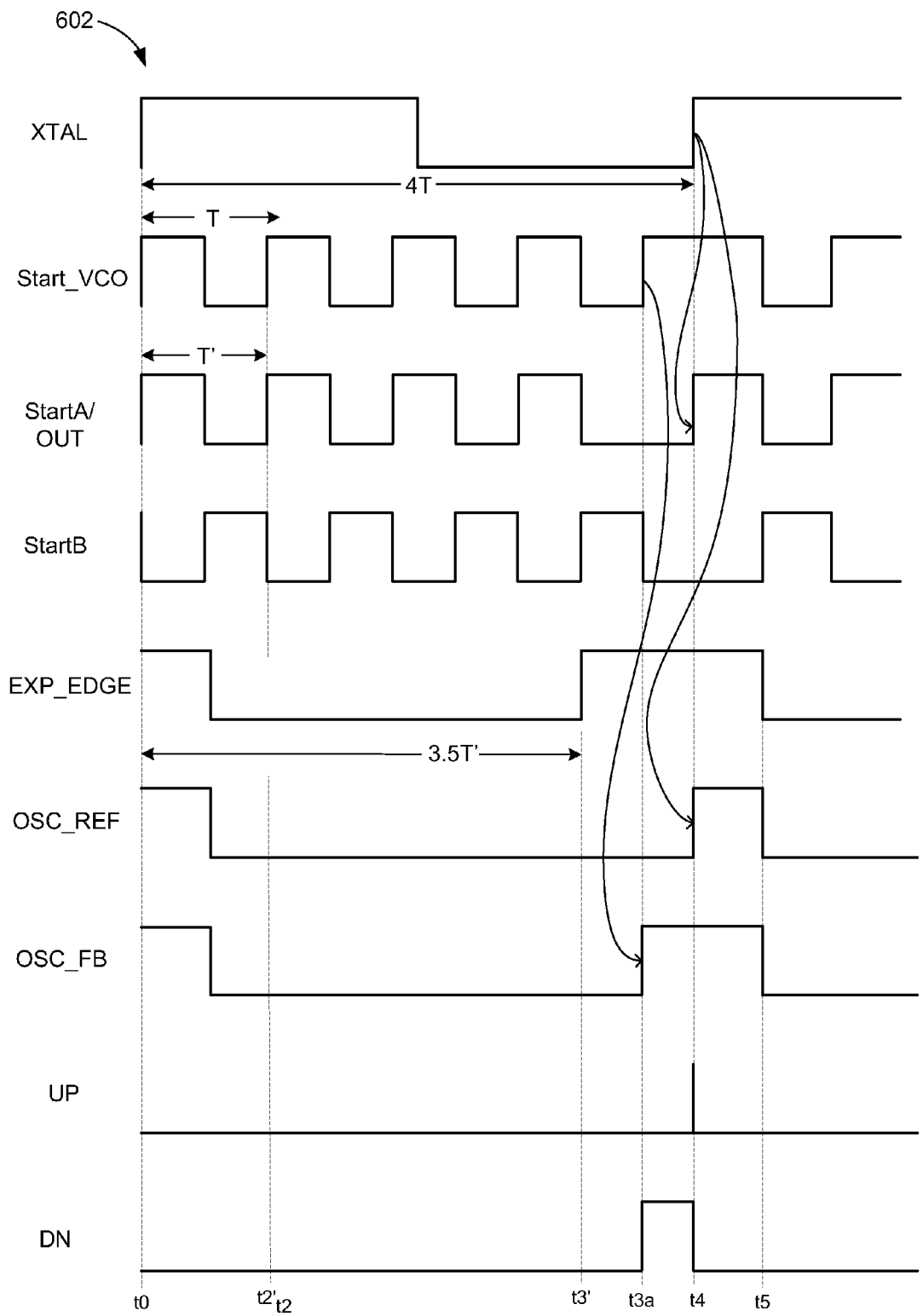
FIG. 6B is a waveform diagram illustrating an exemplary operation of the DLL circuit of FIG. 2 in a fast VCO case.

An exemplary operation of VCO 300 for generating an output oscillation signal OUT having a frequency that is an integer n=4 times the frequency of the input signal XTAL (e.g., $f_{OUT}=4*f_{XTAL}$) is described below with respect to the illustrative timing diagram 601 of FIG. 6A and the illustrative flow chart 650 of FIG. 6D. When the input signal XTAL is ready at time t0, control circuit 340 asserts synchronization signal EXP_EDGE to logic high, which causes MUX 331 to forward the input signal XTAL to the input of first delay element 320(1), thereby allowing the signal XTAL to initialize operation of the oscillator circuit 305 formed by SR latch 310 and delay elements 320(1)-320(2) (652). Upon receiving the positive edge of the input signal XTAL, first delay element 320(1) asserts its output signal RESET to logic high after the first delay period D1 associated with first delay element 320(1) (654). The resulting logic high state of RESET causes SR latch 310 to drive its Q output (and thus signal Start_VCO) to logic low and to drive its $\overline{Q}$ output (and thus signal StartB) to logic high, at time t1 (656).

Just as the RESET signal is asserted from logic low to logic high by first delay element 320(1) at time t1, control circuit 340 de-asserts EXP_EDGE to logic low. In response thereto, MUX 331 couples the Q output of SR latch 310 to the input of first delay element 320(1), thereby providing signal Start_VCO from the Q output of SR latch 310 as both the signal StartA to first delay element 320(1) and as the VCO's output signal OUT (658). In this manner, MUX 331 closes the loop between the Q output of SR latch 310 and the input of first delay element 320(1), thereby allowing oscillator circuit 305 to begin oscillating independently of the input signal XTAL.

In response to the asserted logic high state of StartB, second delay element 320(2) asserts its output signal SET to logic high after its associated delay period D2 (660). The resulting logic high state of SET causes SR latch 310 to drive its Q output (and thus signal Start_VCO) to logic high and to drive its $\overline{Q}$ output (and thus signal StartB) to logic low, at time t2 (662). In this manner, a positive clock edge derived from the input signal XTAL circulates through oscillator circuit 305 to produce an oscillating output signal OUT having a period of T. As depicted in FIG. 6A, the input signal XTAL has a period of 4T.

As mentioned above, for the exemplary embodiment of FIG. 3A described herein, VCO 300 generates an output signal OUT having a frequency that is n=4 times the frequency of the input signal XTAL. Thus, the positive edge of input signal XTAL should align with every n=$4^{th}$ positive edge of output signal OUT. To ensure that the output signal OUT remains synchronized with the input signal XTAL, the control circuit 340 may select the second input of MUX 331 to receive the input signal XTAL every n=4 periods of output signal OUT to allow the positive edge of input signal XTAL to reset (e.g., re-align) the positive edge of the output signal OUT.

More specifically, at time t3, which occurs after approximately 3.5 periods of the VCO's output signal OUT, control circuit 340 asserts EXP_EDGE to logic high, which in turn allows AND gate 332 to selectively assert OSC_FB in response to Start_VCO and allows AND gate 333 to selectively assert OSC_REF in response to XTAL (664). Thereafter, the signals OSC_FB and OSC_REF may be compared by PFD 210 and processed by charge pump 220 to generate the control voltage $V_C$ (666), and the control voltage $V_C$ may be used to adjust the oscillation frequency of the output signal OUT (668).

For some embodiments, control circuit 340 may assert EXP_EDGE in response to counter 341 detecting 3.5 periods of the signal StartA. In response thereto, MUX 331 forwards signal XTAL as StartA to first delay element 320(1), thereby allowing the next positive edge of signal XTAL at time t4 to circulate through oscillator 305 and trigger the next positive edge of StartB. In this manner, the positive edge of input signal XTAL may be used to reset (e.g., re-align) the clock edge circulating through oscillator 305, thereby maintaining a delay-lock between signals XTAL and OUT.

Note that because the signal Start_VCO transitions to logic high at time t4 while EXP_EDGE is asserted to logic high, AND gate 332 asserts the feedback signal OSC_FB to logic high at time t4. Similarly, because the signal XTAL transitions to logic high at time t4 while EXP_EDGE is asserted to logic high, AND gate 333 asserts the reference signal OSC_REF to logic high at time t4. Referring also to FIG. 2, the PFD 210 compares the phase difference between the reference and feedback signals OSC_REF and OSC_FB to generate the UP and DN signals that adjust the control voltage $V_C$ for VCO 300. In one embodiment, when the signals OSC_REF and OSC_FB are in-phase with each other (e.g., which indicates that the output signal OUT is properly aligned with the crystal oscillator signal XTAL), as depicted in FIG. 6A, the PFD 210 will not adjust (or will make small adjustments to) the control voltage $V_C$.

Then, at time t5, control circuit 340 again de-asserts EXP_EDGE to logic low. For some embodiments, control circuit 340 may de-assert EXP_EDGE in response to counter 341 detecting one period of the signal StartA subsequent to assertion of EXP_EDGE. In response to the de-asserted state of EXP_EDGE, MUX 331 couples the Q output of SR latch 310 to the input of first delay element 320(1), thereby providing the signal Start_VCO from the Q output of SR latch 310 as both the signal StartA to first delay element 320(1) and as the VCO 300 output signal OUT. In this manner, MUX 331 again closes the loop between the Q output of SR latch 310 and the input of first delay element 320(1), thereby allowing oscillator circuit 305 to once again oscillate independently of the input signal XTAL.

Referring also to FIG. 3A, if the VCO output signal OUT begins drifting with respect to the input signal XTAL, the feedback loop may re-align the clock edge circulating through oscillator 305 so that the output signal OUT becomes synchronized with the input signal XTAL. For example, FIG. 6B is a waveform diagram 602 illustrating an exemplary operation of the VCO 300 of FIG. 3A to correct a "fast VCO" case in which it is desired to decrease the frequency of the output signal OUT (e.g., with respect to the input signal XTAL). As depicted in FIG. 6B, the output signal OUT has a period of T' that is shorter than the desired period T of the output signal OUT of FIG. 6A, and therefore more than 4 cycles of the signal OUT may occur within a single period of the input signal XTAL. Thus, for example, while the output signal OUT in FIG. 6B completes a period at time t2', the output signal OUT should not complete a period until time t2. Accordingly, to re-align the rising edges of the output signal OUT with the rising edges of the input signal XTAL, the synchronization logic 330 slows down oscillator circuit 305.

More specifically, after approximately 3.5 periods of the signal StartA, control circuit 340 asserts EXP_EDGE to logic high at time t3'. In response thereto, MUX 331 forwards the input signal XTAL as StartA to the input of first delay element 320(1). In this manner, the next positive edge of signal StartA is triggered by the next positive edge of input signal XTAL (e.g., rather than by the next positive edge of signal Start_VCO). Further, because EXP_EDGE is asserted, the next positive edge of signal Start_VCO causes AND gate 332 to assert the feedback signal OSC_FB to logic high at time t3a, and the next positive edge of input signal XTAL causes AND gate 333 to assert the reference signal OSC_REF to logic high at time t4.

The PFD 210 of FIG. 2 compares the phase difference between OSC_FB and OSC_REF, and in response thereto, asserts the DN signal just after time t3a and asserts the UP signal just after time t4. Because the DN signal is asserted prior to and longer than the UP signal, charge pump 220 adjusts (e.g., decreases) the control voltage $V_C$ in a manner that causes VCO 300 to decrease the oscillation frequency of its output signal OUT. Accordingly, when control circuit 340 de-asserts EXP_EDGE at time t5, which causes MUX 331 to forward signal Start_VCO as signal StartA, the output signal OUT is again synchronized with the input signal XTAL. Accordingly, for the exemplary embodiment of FIG. 6B, assertion of the feedback signal OSC_FB prior to and longer than assertion of the reference signal OSC_REF causes the VCO 300 to decrease the oscillation frequency of the output signal OUT until it is delay-locked with the input signal XTAL.

Figure 6C:
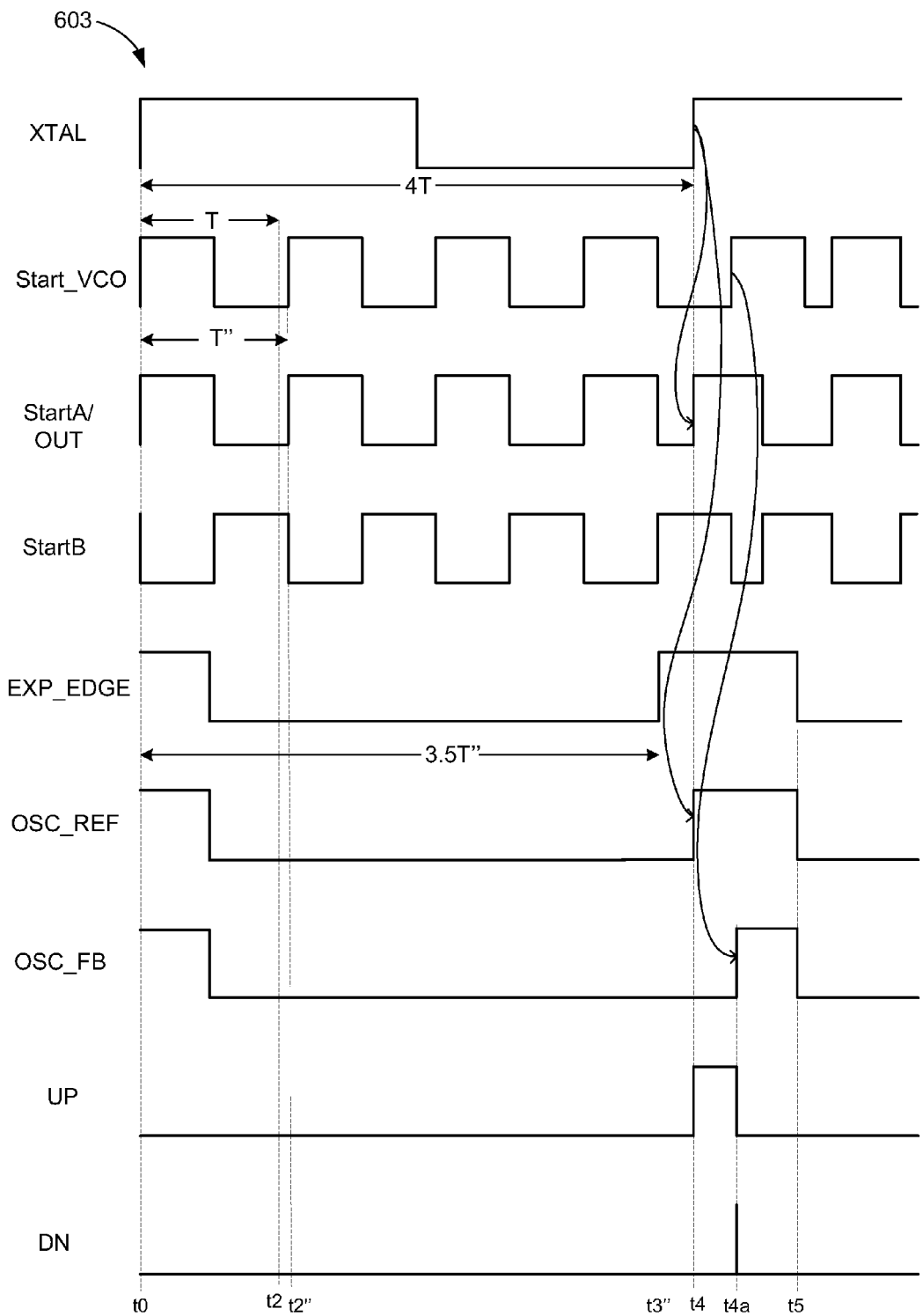
FIG. 6C is a waveform diagram illustrating an exemplary operation of the DLL circuit of FIG. 2 in a slow VCO case.
Figure 6D:
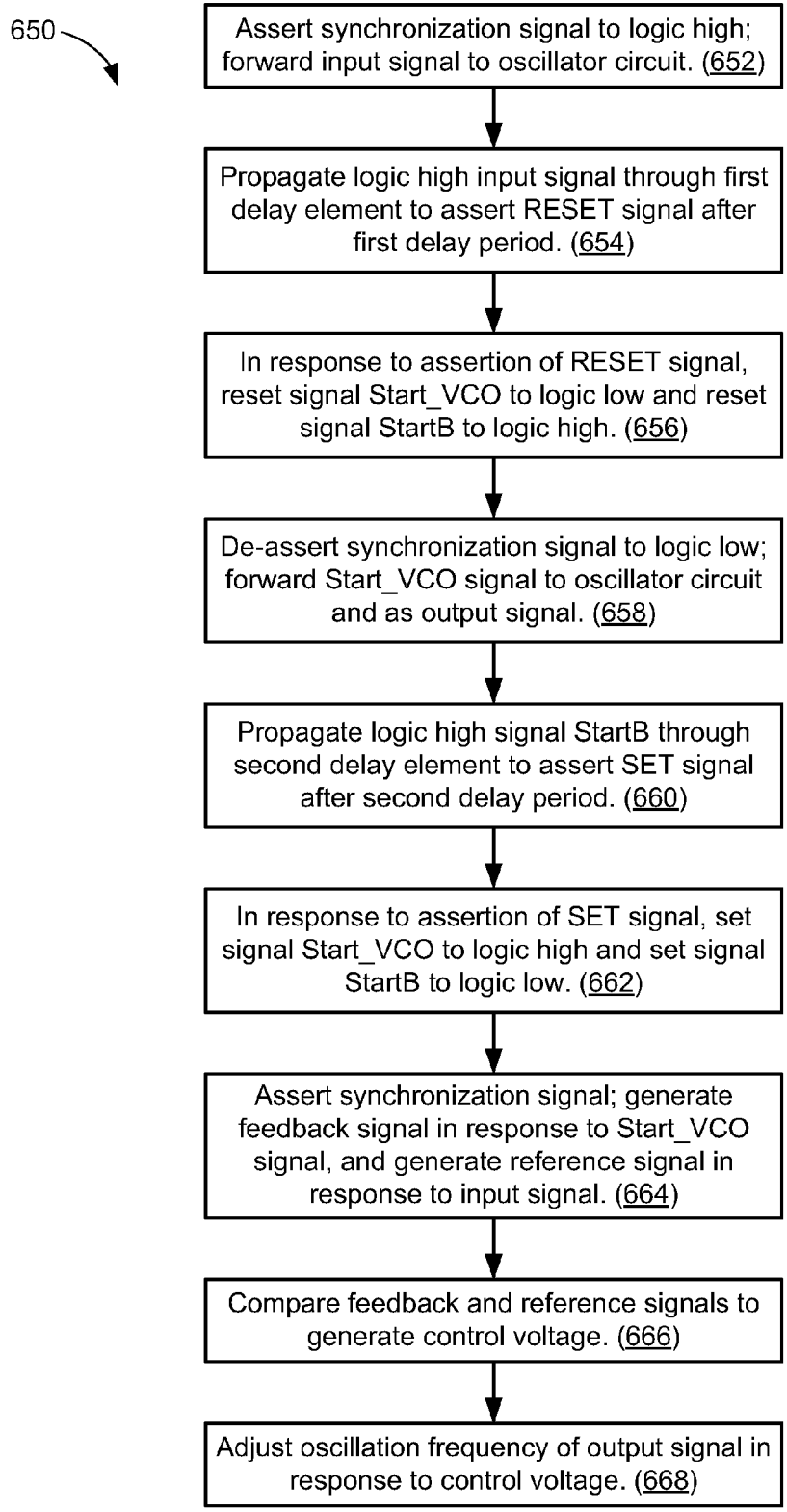
FIG. 6D is an illustrative flow chart of an exemplary operation of the VCO circuit of FIG. 3A.

FIG. 6C is a waveform diagram 603 illustrating an exemplary operation of the VCO 300 of FIG. 3A to correct a "slow VCO" case in which it is desired to increase the frequency of the output signal OUT (e.g., with respect to the input signal XTAL). As depicted in FIG. 6C, the output signal OUT has a period of T" that is longer than the desired period T of the output signal OUT of FIG. 6A, and therefore less than 4 cycles of the signal OUT occur within a single period of the input signal XTAL. Accordingly, to re-align the rising edges of the output signal OUT with the rising edges of XTAL, the synchronization logic 330 may speed up oscillator circuit 305.

More specifically, after approximately 3.5 periods of the signal StartA, control circuit 340 asserts EXP_EDGE to logic high at time t3". In response thereto, MUX 331 forwards the signal XTAL as StartA to the input of first delay element 320(1). In this manner, the next positive edge of signal StartA is triggered by the next positive edge of signal XTAL (e.g., rather than by the next positive edge of signal Start_VCO). Further, because EXP_EDGE is asserted, the next positive edge of signal XTAL causes AND gate 333 to assert the reference signal OSC_REF to logic high at time t4, and the next positive edge of signal Start_VCO causes AND gate 332 to assert the feedback signal OSC_FB to logic high at time t4a.

The PFD 210 of FIG. 2 compares the phase difference between OSC_FB and OSC_REF, and in response thereto, asserts the UP signal just after time t4 and asserts the DN signal just after time t4a. Because the UP signal is asserted prior to and longer than the DN signal, charge pump 220 adjusts (e.g., increases) the control voltage $V_C$ in a manner that causes VCO 300 to increase the oscillation frequency of its output signal OUT. Accordingly, when control circuit 340 de-asserts EXP_EDGE at time t5, which causes MUX 331 to forward signal Start_VCO as signal StartA, the oscillator output signal OUT is again synchronized with the signal XTAL. Accordingly, for the exemplary embodiment of FIG. 6C, assertion of the reference signal OSC_REF prior to and longer than assertion of the feedback signal OSC_FB causes the VCO 300 to increase the oscillation frequency of the output signal OUT until it is delay-locked with the input signal XTAL.

Note that there may be a lower limit on the oscillation frequency of the output signal OUT provided by the VCO 300. For example, if during an acquisition phase the next edge of the input signal XTAL arrives before the EXP_EDGE signal is asserted, the PFD 210 of FIG. 2 may not generate values of the control signals UP and DN that cause the VCO 300 to increase the oscillation frequency, and therefore the DLL 200 of FIG. 2 may not reach the desirable steady state. For the frequency multiplication factor of n=4 discussed above, if the next edge of the input signal XTAL occurs before the completion of 3.5 cycles of the VCO output signal StartA/OUT, (e.g., which triggers assertion of EXP_EDGE), then DLL 200 may not reach its steady state.

Thus, in accordance with the present embodiments, if the next edge of the input signal XTAL is detected to occur before the control signal EXP_EDGE is asserted, then a separate circuit block/mechanism (e.g., acquisition logic, not shown for simplicity) is activated and the phase correction mechanism described above is bypassed. In this case, the VCO 300, the PFD 210, and the counter 341 may be maintained in a reset state until a subsequent edge of the input signal XTAL occurs. Thereafter, the subsequent edge of the input signal XTAL may begin circulating through the VCO 300's two delay elements 320(1)-320(2). In this manner, the UP signal may be asserted to cause the VCO 300 to increase the oscillation frequency of the output signal OUT (e.g., while no DN signal is asserted). Because the UP signal may not be generated when the acquisition logic is activated, the UP signal may be asserted during the first half of the next period of the VCO output signal OUT.

Note the acquisition logic may be activated even if the next edge of input signal XTAL occurs at or even slightly after 3.5 periods of the VCO output signal. For example, as depicted in the slow VCO case of FIG. 6C, the time interval available may be shortened for the reset of first delay element 320(1) after the signal StartA is de-asserted and before the next edge of the input signal XTAL occurs. The same is true for the time interval available for the reset of second delay element 320(2) after the signal StartB is de-asserted at the end of the 4th period of the VCO output signal and before signal StartB is again asserted after half a period in the next cycle. Because of the time associated with resetting delay elements 320(1)-320(2), the acquisition logic activates unless the next edge of input signal XTAL arrives significantly after 3.5 periods of the VCO output signal.

Figure 7:
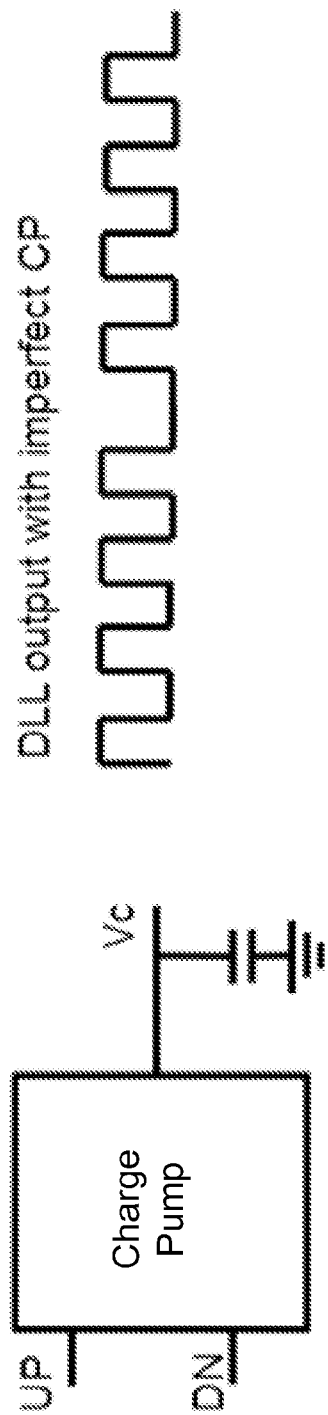
FIG. 7 depicts the effects of charge pump static phase error on the DLL output signal.

Referring again to FIG. 2, it is noted that some conventional charge pumps may have mismatched currents related to the UP and DN signals received from PFD 210, and may also inject parasitic charge into the control voltage $V_C$ generated in response to the UP and DN signals. More specifically, if assertion of the UP and DN signals by PFD 210 are aligned with each other (e.g., at the same time), then conventional embodiments of charge pump 220 may inject parasitic charge into the control voltage ($V_C$) during every reference cycle. To compensate for the injection of parasitic charge into $V_C$, assertion of the UP and DN signals may be offset by a time offset value $\Delta T$ so that charge pump 220 adds zero charge at every cycle. The time offset value $\Delta T$ may be represented as: $\Delta T = t_{startUP} - t_{startDN}$. However, temporally spacing assertion of the UP and DN signals by a time offset value $\Delta T$ may cause VCO 240 to operate at an incorrect frequency, and may also cause imbalances in the duty cycle of the VCO output signal, for example, as depicted in FIG. 7. In addition, offsetting assertion of the UP and DN signals by $\Delta T$ may create reference spurs in the spectrum of the DLL's output signal OUT.

Figure 8:
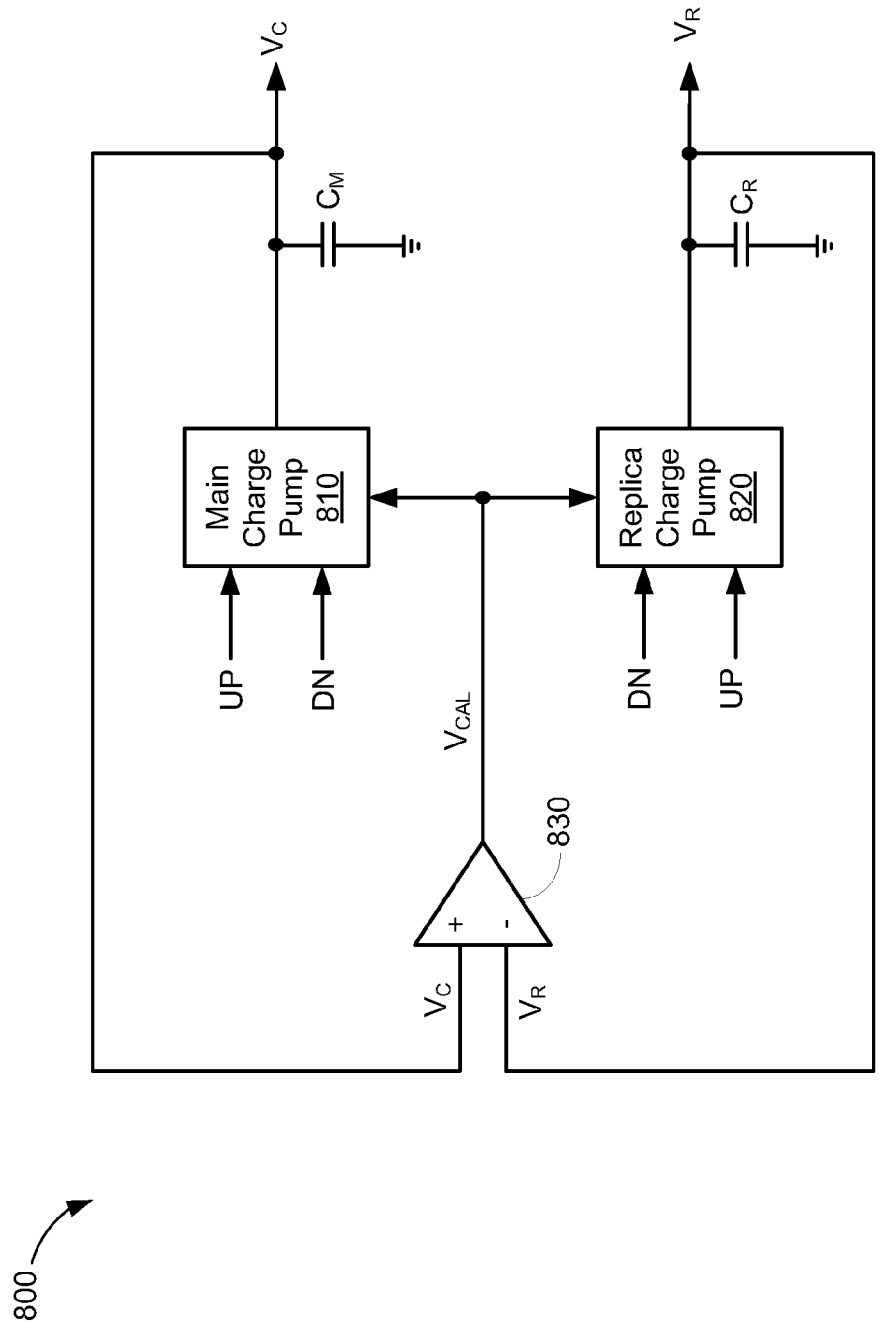
FIG. 8 is a block diagram of one embodiment of a charge pump circuit that may be employed in the DLL circuit of FIG. 2.

FIG. 8 illustrates a charge pump circuit 800 that is one embodiment of charge pump 220 of FIG. 2. As shown in FIG. 8, charge pump circuit 800 includes a main charge pump 810, a replica charge pump 820, and an operational amplifier (op-amp) 830. Main charge pump 810 includes inputs to receive the UP and DN signals, a control input to receive a calibration voltage signal ($V_{CAL}$), and an output to generate the control voltage $V_C$ (e.g., that is provided to VCO 240 of DLL 200 of FIG. 2). The output capacitance of main charge pump 810 may be modeled by a main charge pump capacitance $C_M$. Replica charge pump 820 includes inputs to receive the UP and DN signals, a control input to receive $V_{CAL}$, and an output to generate a replica control voltage $V_R$. The output capacitance of replica charge pump 820 may be modeled by a replica charge pump capacitance $C_R$. For some embodiments, main charge pump 810 and replica charge pump 820 may be any suitable charge pumps. For one embodiment, replica charge pump 820 may be smaller than main charge pump 810 in order to, for example, reduce area and power consumption.

Op-amp 830 includes a positive input to receive $V_C$ from main charge pump 810, a negative input to receive $V_R$ from replica charge pump 820, and an output to generate the calibration voltage signal $V_{CAL}$. In operation, op-amp 830 compares $V_C$ and $V_R$ to generate $V_{CAL}$, and therefore the calibration voltage $V_{CAL}$ is indicative of differences between the control voltage $V_C$ and the replica control voltage $V_R$.

More specifically, the current in main charge pump 810 associated with assertion of the UP and/or DN signals may be adjusted in response to the calibration voltage signal $V_{CAL}$ to modify the relative magnitudes of its corresponding up and down currents. Similarly, the current in replica charge pump 820 associated with assertion of the UP and/or DN signals may be adjusted in response to the calibration voltage signal $V_{CAL}$ to modify the relative magnitudes of its corresponding up and down currents. However, in accordance with the present embodiments, while the UP and DN signals are provided to respective UP and DN input terminals of main charge pump 810, the UP and DN signals are reversed and provided to respective DN and UP input terminals of replica charge pump 820 (e.g., as depicted in FIG. 8). In this manner, the replica control voltage $V_R$ generated by replica charge pump 820 may be adjusted in response to $V_{CAL}$ until $V_R$ equals the control voltage $V_C$ generated by main charge pump 810.

More specifically, because main charge pump 810 and replica charge pump 820 receive the same UP and DN input signals, receive the same calibration voltage $V_{CAL}$, and generate equal output voltages VC and VR, respectively, main charge pump 810 and replica charge pump 820 should exhibit the same timing offset value at their input terminals. Thus, while the timing offset value for main charge pump 810 may be expressed as $\Delta T_{810} = t_{startUP} - t_{startDN}$, the timing offset value for replica charge pump 820 may be expressed as $\Delta T_{820} = t_{startDN} - t_{startUP}$ (e.g., because the input signals UP and DN are reversed for replica charge pump 820). This implies that $\Delta T_{810} = -\Delta T_{820}$. As a result, the total time offset value for charge pump circuit 800 becomes zero, and the phase error is calibrated.

Referring again to FIG. 3A, the oscillator 305 is advantageous over conventional ring oscillators for several reasons. First, oscillator 305 may generate oscillation output signals using only two delay elements 320(1) and 320(2) (e.g., that introduce a first externally-adjustable predetermined delay period D1 between the Q output and reset input of latch 310 and a second externally-adjustable predetermined delay period D2 between the $\overline{Q}$ output and set input of latch 310, respectively). In contrast, conventional ring oscillators typically require an odd number greater than one of delay stages (e.g., 3 or more) to enable logic state transitions (and thus oscillations) in the output signal.

Compared to conventional relaxation oscillators, oscillator 305 of FIG. 3A is smaller and less complex. Unlike many conventional relaxation oscillators, oscillator 305 of FIG. 3A does not include voltage comparators or RC filters, and does not depend upon the generation of reference voltages or reference currents. Indeed, the simplicity of oscillator 305 may allow it to be implemented using digital circuits (e.g., rather than analog circuits).

In addition, for the oscillator 305 of FIG. 3A, a single rising or positive edge propagates through all the circuit elements (e.g., delay elements 320(1)-320(2) and gates NOR1-NOR2) once in each oscillation period, which may be advantageous for some embodiments. In contrast, conventional ring oscillators typically propagate both a positive edge and a negative edge (e.g., edges that are 180 degrees out of phase with each other) through the ring in each oscillation period. For the oscillator 305 of FIG. 3A, once the single edge enters the second delay 320(2) for the last time in the oscillation period (i.e., the oscillator phase enters the second half of the last oscillation period in the reference period and the EXP_EDGE signal is asserted), the first delay 320(1) is reset and ready to receive a new edge from the crystal oscillator 250. For a conventional ring oscillator, when the oscillator phase enters the second half of the last oscillation period in the reference period, and the new edge must enter the ring, there already exists an edge of opposite polarity circulating in the ring which will generate the OSC_FB signal, and the two edges might collide and swallow each other or otherwise interact and negatively impact the operation of the DLL.

As mentioned above, for some embodiments, the oscillator 305 of FIG. 3A may be implemented using delay elements 320(1)-320(2) that propagate positive or rising edges more quickly than negative or falling edges. For other embodiments, delay elements 320(1)-320(2) may be configured to propagate positive edges more quickly than negative or falling edges, for example, so that oscillator 305 propagates a single negative edge through circuit elements 310 and 320(1)-320(2) to generate complementary oscillation output signals at terminals Q and $\overline{Q}$. For such other embodiments, NOR gates NOR1 and NOR2 of SR latch 110 may be replaced by NAND gates.

Figure 3B:
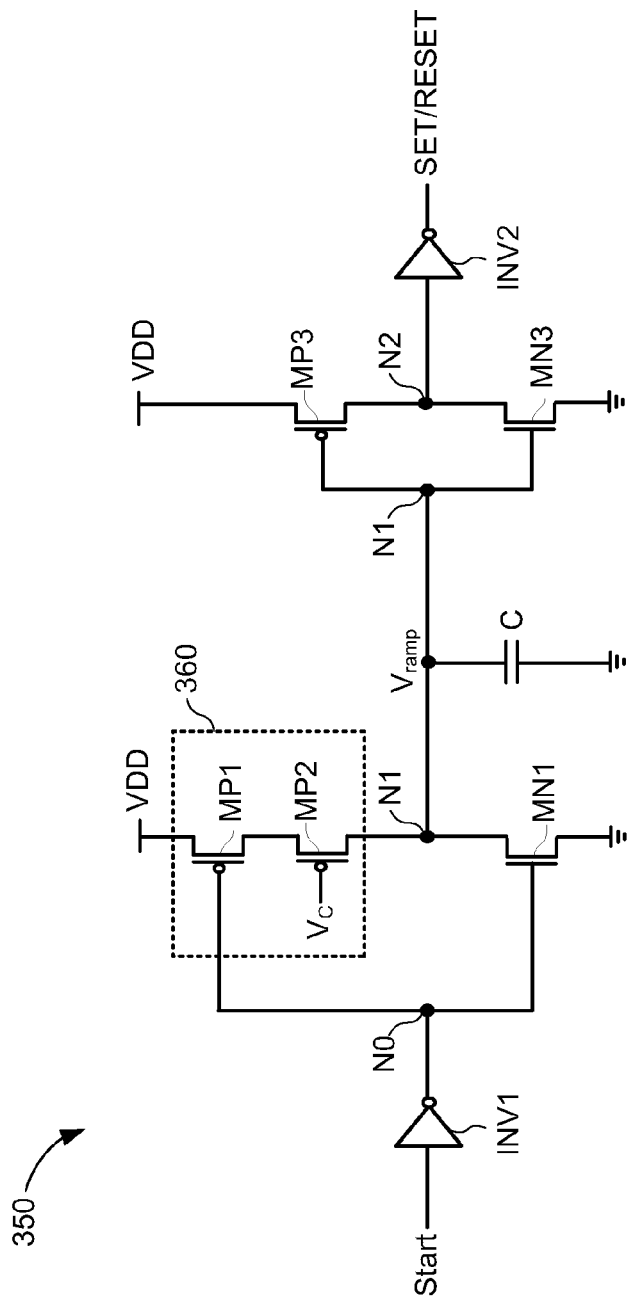
FIG. 3B shows a voltage-controlled delay element that, in accordance with some embodiments, may be used as the delay element(s) in the VCO circuit of FIG. 3A.

For some embodiments, a voltage-controlled delay element may be used for delay elements 320(1) and 320(2) of oscillator 305. For example, FIG. 3B shows a delay element 350 that is one embodiment of delay elements 320(1) and/or 320(2) of FIG. 1. Delay element 350 is shown to include CMOS inverters INV1-INV2, PMOS transistors MP1-MP3, NMOS transistors MN1 and MN3, and a capacitor C. INV1 has an input to receive the associated start signal, and has an output coupled to the gates of transistors MP1 and MN1 at node NO. Transistors MP1 and MP2 are coupled in series between VDD and a charging node N1, and pull-down transistor MN1 is coupled between node N1 and ground potential. Transistor MP2 includes a gate to receive a control voltage ($V_C$), and may thus operate together with transistor MP1 as a voltage-controlled current source. Capacitor C is coupled between node N1 and ground potential, where the commonly coupled sources of MP2 and MN1 at node N1 provide a ramp voltage ($V_{ramp}$) to capacitor C. Transistors MP3 and MN3 are coupled in series between VDD and ground potential, and form an inverter having an input at node N1 and an output at node N2. INV2 has an input coupled to node N2 and an output to generate the associated signal SET or RESET.

In operation, transistors MP1-MP2 may act as a weak pull-up circuit 360 that slowly charges capacitor C by developing the ramp voltage $V_{ramp}$ on its top plate, while transistor MN1 may act as a strong pull-down circuit that quickly discharges capacitor C. The control voltage ($V_C$) provided to the gate of transistor MP2 adjusts the charging current for capacitor C, and therefore may adjust the oscillation frequency by adjusting the delay period associated with asserting the SET or RESET signal to logic high in response to positive edge in the start signal.

More specifically, when the input Start signal transitions from logic low to logic high, inverter INV drives NO low toward ground potential. In response thereto, NMOS transistor MN1 turns off and isolates node N1 from ground potential, and PMOS transistor MP1 turns on. The control voltage $V_C$ is driven to a level that turns on PMOS transistor MP2 (e.g., to a voltage that is less positive than the threshold voltage of MP2), thereby pulling node N1 high towards VIDE) and charging capacitor C. The speed at which transistor MP2 charges capacitor C may be adjusted by adjusting the control voltage $V_C$. When the voltage at node N1 exceeds the threshold voltage of the CMOS inverter formed by transistors MP3 and MN3, transistor MP3 turns off and transistor MN3 turns on, thereby pulling node N2 low toward ground potential. In response thereto, inverter INV2 asserts the SET or RESET signal to a logic high state.

Thereafter, when the input Start signal transitions from logic high to logic low, inverter INV drives NO high towards VDD. In response thereto, PMOS transistor MP1 turns off and isolates node N1 from VDD, and NMOS transistor MN1 turns on and quickly discharges node N1 low towards ground potential. Once the voltage at node N1 falls below the threshold voltage of the CMOS inverter formed by transistors MP3 and MN3, transistor MP3 turns on and transistor MN3 turns off, thereby pulling node N2 high towards VDD. In response thereto, inverter INV2 de-asserts the SET or RESET signal to a logic low state.

Note that the exemplary delay element 350 of FIG. 3B is configured to circulate a positive edge when used as delay elements 320(1)-320(2) in oscillator 305. For embodiments in which oscillator 305 may be configured to circuit a negative edge through delay elements 320(1)-320(2) and SR latch 110, delay element 350 may be modified to de-assert the SET or RESET signal in response to a falling edge of the Start signal in a relatively slow manner, and to assert the SET or RESET signal in response to a rising edge of the Start signal in a relatively quick manner.

For some applications, it may be desirable to adjust the oscillation frequency in larger discrete steps than allowed by adjusting the control voltage $V_C$. For the delay element 360 of FIG. 3B, the oscillation frequency may be adjusted in larger discrete steps by (1) partitioning the pull-up circuit 350 into several individually selectable charging circuits and then selectively enabling one or more of such individually selectable charging circuits (e.g., to incrementally adjust the charging current provided to capacitor C of FIG. 3B) and/or by (2) partitioning the capacitor C into several individually selectable capacitor circuits and then selectively enabling one or more of such individually selectable capacitor circuits (e.g., to incrementally adjust the capacitance value of capacitor C of FIG. 3B). In this manner, binary weighted partitioning techniques can be used for programming the delay period provided by delay element 350 of FIG. 3B, for example, as described in more detail below with respect to FIGS. 4 and 5.

Figure 4:
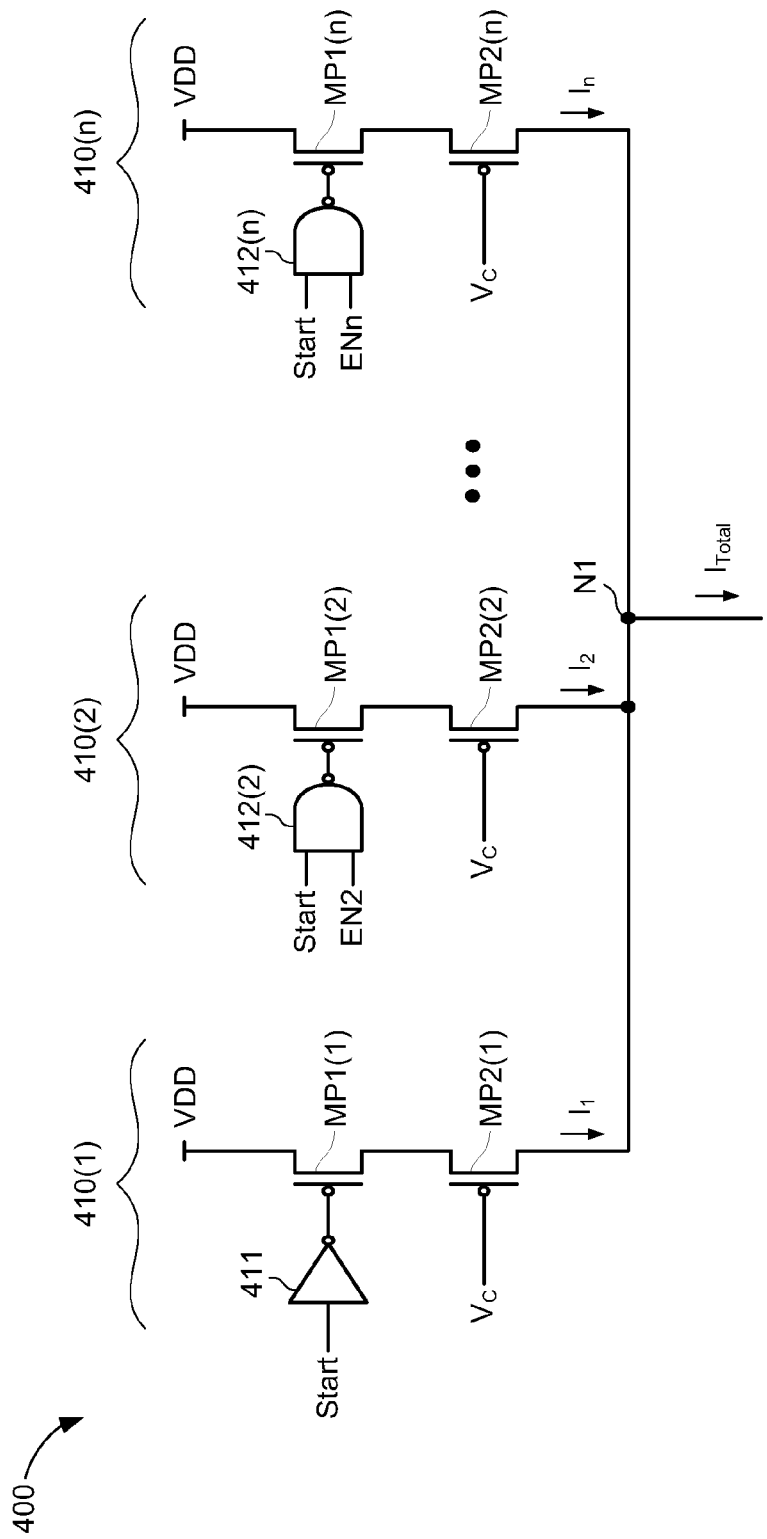
FIG. 4 is a circuit diagram of a programmable pull-up circuit that, in accordance with some embodiments, may be used as the pull-up circuit in the delay element of FIG. 3B.

For example, FIG. 4 shows a programmable pull-up circuit 400 that may be used as pull-up circuit 360 of delay element 350 of FIG. 3B. Pull-up circuit 400 may include any number n of individually selectable pull-up or charging circuits 410(1)-410(n) coupled in parallel to provide an adjustable charging current $I_{Total}$ for capacitor C of delay element 350 of FIG. 3B. As shown in FIG. 4, each of individually selectable charging circuits 410(1)-410(n) includes first and second PMOS transistors MP1(x) and MP2(x) coupled in series between VDD and node N1 to provide a corresponding current $I_1$-$I_n$ that may be used to charge the capacitor C of delay element 350. The gates of first PMOS transistors MP1(1)-MP1(n) are controlled by the Start signal and/or by a corresponding one of enable signals EN2-ENn, and the gates of PMOS transistors MP2(1)-MP2(n) are controlled by the control voltage $V_C$.

For the exemplary embodiment of FIG. 4, the first charging circuit 410(1) is maintained in a conductive state, and the Start signal is provided to its pull-up transistor MP1(1) via inverter 411 so that assertion of the Start signal to logic high turns on transistor MP1(1), and de-assertion of the Start signal to logic low turns off charging MP1(1). Each of the other individually selectable charging circuits 410(2)-410(n) can be selectively enabled in response to corresponding enable signals EN2-ENn, which are logically combined with the Start signal in corresponding NAND gates 412(2)-412(n). Thus, for example, to enable charging circuit 410(2), EN2 is driven to logic high, which causes NAND gate 412(2) to pass a logical complement of the Start signal to the gate of MP1(2). In this manner, NAND gate 412(2) turns on transistor MP1(2) when the Start signal is logic high and turns off MP1(2) when the Start signal is logic low. Conversely, to disable charging circuit 410(2), EN2 is driven to logic low, thereby forcing the output of NAND gate 412(2) to logic high and maintaining transistor MP1(2) in a non-conductive state.

Accordingly, the amount of current $I_{Total}$ for charging capacitor C may be increased in discrete amounts by enabling a greater number of the charging circuits 410(1)-410(n), and the amount of current $I_{Total}$ for charging capacitor C may be decreased in discrete amounts by enabling a fewer number of the charging circuits 410(1)-410(n).

For the exemplary embodiment of FIG. 4, each of charging circuits 410(1)-410(n) is shown to receive the same control voltage signal $V_C$. For other embodiments, each of charging circuits 410(1)-410(n) may receive its own control voltage, thereby allowing for additional adjustments to the total current $I_{Total}$ provided by circuit 400 for charging capacitor C of FIG. 3B.

Figure 5:
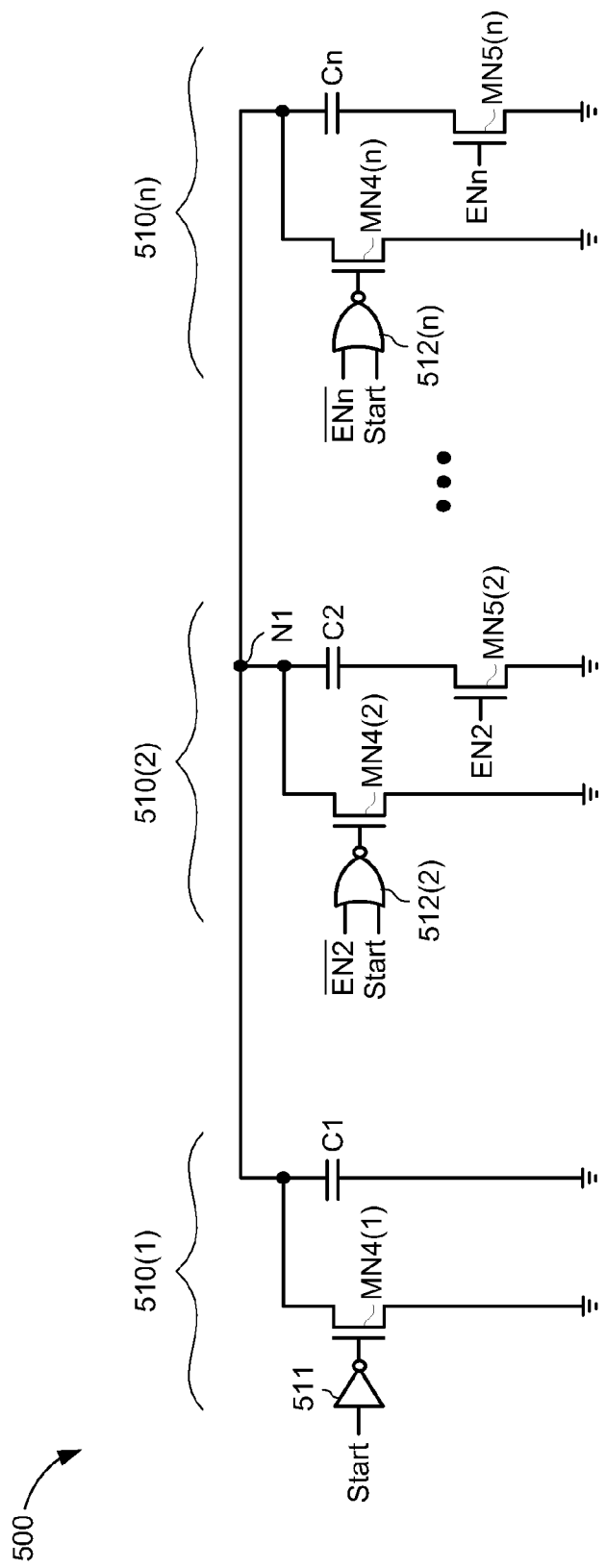
FIG. 5 is a circuit diagram of a programmable capacitor circuit that, in accordance with some embodiments, may be used as the capacitor of the delay circuit of FIG. 3B.

FIG. 5 shows a programmable capacitor circuit 500 that can be used as capacitor C in the delay element 350 of FIG. 3B. Capacitor circuit 500 may include any number n of individually selectable capacitor circuits 510(1)-510(n) coupled in parallel to provide an adjustable capacitor C for delay element 350 of FIG. 3B. As shown in FIG. 5, the first capacitor circuit 510(1) includes a capacitor C1 coupled between node N1 and ground potential. The other capacitor circuits 510(2)-510(n) include respective capacitors C2-Cn that can be selectively coupled between node N1 and ground potential in response to enable signals EN2-ENn, respectively, as depicted in FIG. 5.

More specifically, the first capacitor circuit 510(1) includes capacitor C1 coupled between node N1 and ground potential, and includes an NMOS by-pass transistor MN4(1) coupled in parallel with capacitor C1 (i.e., also coupled between node N1 and ground potential). The gate of transistor MN4(1) receives the Start signal via inverter 511. Thus, first capacitor circuit 510(1) is maintained in an enabled state in which the logic state of the Start signal controls whether node N1 is shorted to ground potential via transistor MN4(1). For example, when the Start signal is asserted to logic high, inverter 511 drives the gate of transistor MN(4) to logic low, thereby turning off transistor MN4(1) to allow capacitor C1 to be charged towards VDD (e.g., by pull-up circuit 360 of FIG. 3B). Conversely, when the Start signal is de-asserted to logic low, inverter 511 drives the gate of transistor MN4(1) to logic high, thereby turning on transistor MN4(1) and quickly discharging node N1 low towards ground potential.

Each of the other individually selectable capacitor circuits 510(2)-510(n) can be selectively enabled in response to corresponding enable signals EN2-ENn. For each of capacitor circuits 510(2)-510(n), the corresponding enable signal is provided to the gate of an NMOS isolation transistor MN5, and the complement of the corresponding enable signal is logically combined with the Start signal via a NOR gate 512 to control the gate of a corresponding bypass transistor MN4.512(n). For example, second capacitor circuit 510(2) includes capacitor C2 and NMOS transistor MN5(2) coupled in series between node N1 and ground potential, and includes an NMOS by-pass transistor MN4(2) coupled in parallel with capacitor C2. The gate of transistor MN5(2) receives the corresponding enable signal EN2, and the gate of transistor MN4(2) receives a logical combination of the Start signal and EN2 via NOR gate 512(2).

In operation, capacitor circuit 510(2) may be enabled by asserting EN2 to logic high, which turns on transistor MN5(2) and allows the Start signal to control the gate of bypass transistor MN4(2). More specifically, when capacitor circuit 510(2) is enabled, assertion of the Start signal to logic high drives the gate of transistor MN4(2) to logic low via NOR gate 512(2), thereby maintaining transistor MN4(2) in a non-conductive state to allow capacitor C2 to be charged high towards VDD (e.g., by pull-up circuit 360 of FIG. 3B). Conversely, de-assertion of the Start signal to logic low drives the gate of transistor MN4(2) to logic high via NOR gate 512(2), thereby turning transistor MN4(2) on and discharging node N1 low towards ground potential via transistor MN4(1).

To disable capacitor circuit 510(2), EN2 may be de-asserted to logic low, which turns off transistor MN5(2) to isolate capacitor C2 from ground potential. The resulting logic high state of $\overline{EN2}$ forces the gate of transistor MN4(2) to logic low, thereby maintaining transistor MN4(2) in a non-conductive state to prevent a short circuit to ground potential.

Accordingly, the amount of capacitance between node N1 and ground potential in programmable capacitor circuit 500 may be increased by enabling a greater number of the individually selectable capacitor circuits 510(2)-510(n), and may be decreased by enabling a fewer number of the individually selectable capacitor circuits 510(2)-510(n). In this manner, the time required to charge the total capacitance value C of circuit 500, and thus the magnitude of the delay period associated with delay element 350 of FIG. 3B, may be dynamically adjusted using the enable signals EN2-ENn.

As described above, the programmability functions provided by the programmable pull-up circuit 400 of FIG. 4 and/or the programmable capacitor circuit 500 of FIG. 5 may allow delay element 350 of FIG. 3B to provide both large and small adjustment amounts to the delay period associated with delay element 350. Thus, the amount of delay period provided by delay element 350 may be changed by adjusting the amount of charging current (e.g., using programmable pull-up circuit 400 of FIG. 4), by adjusting the capacitance of the charging capacitor (e.g., using programmable capacitor circuit 500 of FIG. 5), or by adjusting both. As described above, the charging currents provided by embodiments of FIG. 4 and the capacitance value provided by embodiments of FIG. 5 may be adjusted using the enable signal EN2-ENn.

Further, note that FIGS. 4 and 5 depict programmable pull-up circuit 400 and programmable capacitor circuit 500 receive the same set of enable signals. However, for other embodiments, the set of enable signals that control programmable pull-up circuit 400 of FIG. 4 may be different from the set of enable signals that control programmable capacitor circuit 500 of FIG. 5.

In the foregoing specification, the present embodiments have been described with reference to specific exemplary embodiments thereof. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense.

What is claimed is:

1. A delay-locked loop (DLL) circuit, comprising:
 a phase detector, comprising a first input to receive a first signal, a second input to receive a second signal, a first output, and a second output,
 wherein the phase detector is to:
  compare the first signal to the second signal, and
  in response to comparing the first signal to the second signal:
   generate a first control signal on the first output, and generate a second control signal on the second output;
 a charge pump, coupled to the phase detector, to:
  receive the first control signal and the second control signal from the phase detector, and
  generate a voltage in response to receiving the first control signal and the second control signal; and
 a voltage-controlled oscillator (VCO), coupled to the charge pump, comprising a first input to receive an input oscillation signal and a second input to receive the voltage, wherein the VCO is to generate an output oscillation signal, the first signal, and the second signal, wherein the VCO comprises:
 an oscillator circuit to generate the output oscillation signal in response to the voltage; and
 a synchronization logic to align a phase of the output oscillation signal with a phase of the input oscillation signal in response to a synchronization signal.

2. The DLL circuit of claim 1, further comprising:
 a loop filter coupled to an output of the charge pump, wherein the charge pump generating the voltage comprises:
  the charge pump generating a charge to the output of the charge pump, and
  the loop filter generating the voltage in response to receiving the charge from the charge pump.

3. The DLL circuit of claim 1, wherein the VCO is to provide a delay period corresponding to a period of the output oscillation signal.

4. The DLL circuit of claim 1, wherein the phase detector is to selectively assert the first control signal and the second control signal in response to a comparison between a phase of the first signal and a phase of the second signal generated by the VCO.

5. The DLL circuit of claim 1, wherein a frequency of the output oscillation signal comprises an integer multiple of a frequency of the input oscillation signal.

6. The DLL circuit of claim 1, wherein the VCO further comprises:
 a control circuit, coupled to the oscillator circuit and the synchronization logic, to assert the synchronization signal in response to a detection of a predetermined number of cycles of the output oscillation signal.

7. The DLL circuit of claim 6, wherein the oscillator circuit of the VCO comprises:
 a latch including a first input, a second input, a first output, and a second output;
 a first delay element coupled between the first output and the first input of the latch; and
 a second delay element coupled between the second output and the second input of the latch.

8. The DLL circuit of claim 7, wherein one of the first delay element and the second delay element is a programmable delay element that is programmable in response to the voltage.

9. The DLL circuit of claim 8, wherein the programmable delay element comprises:
 a configurable charging circuit to adjust a charging current provided to a charging node in response to one or more first enable signals; and
 a configurable capacitor to adjust a capacitance coupled to the charging node in response to one or more second enable signals.

10. The DLL circuit of claim 7, wherein the synchronization logic comprises:
 a multiplexer (MUX) including a first input to receive an internal oscillation signal from the first output of the latch, a second input to receive the input oscillation signal, an output to provide the output oscillation signal, and a control terminal to receive the synchronization signal.

11. The DLL circuit of claim 10, wherein the synchronization logic further comprises:
 a first logic gate including inputs to receive the internal oscillation signal and the synchronization signal, and including an output to generate the first signal; and
 a second logic gate including inputs to receive the input oscillation signal and the synchronization signal, and including an output to generate the second signal.

12. The DLL circuit of claim 1, wherein the VCO further comprises an acquisition logic coupled to the synchronization logic and the oscillator circuit, the acquisition logic:
 including inputs to receive the input oscillation signal and the synchronization signal; and to bypass the alignment by the synchronization logic if an edge of the input oscillation signal is received before receiving assertion of the synchronization signal.

13. The DLL circuit of claim 12, wherein if the edge of the input oscillation signal is received before the synchronization signal, the acquisition logic is to further place and maintain the VCO in a reset state.

14. The DLL circuit of claim 13, wherein if the edge of the input oscillation signal is received before receiving assertion of the synchronization signal, in response to receiving a subsequent edge of the input oscillation signal, the acquisition logic is to remove the VCO from a reset state by allowing the subsequent edge of the input oscillation signal to be provided to the oscillator circuit.

15. The DLL circuit of claim 12, wherein in response to the acquisition logic being activated, the acquisition logic will generate one of:
the first control signal with a duration longer than a duration of the second control signal, and
the second control signal with a duration longer than a duration of the first control signal,
in order to cause the VCO to increase an oscillation speed of the output oscillation signal.

16. The DLL circuit of claim 15, wherein the increased oscillation speed of the output oscillation signal prevents reactivation of the acquisition logic.

17. A delay-locked loop (DLL) circuit for generating an output oscillation signal in response to an input oscillation signal, the DLL circuit comprising:
a phase detector to generate a first control signal and a second control signal in response to a phase difference between a first signal and a second signal;
a charge pump, coupled to the phase detector, to generate a voltage in response to the first and second control signals; and
a voltage-controlled oscillator (VCO) including inputs to receive the input oscillation signal and the voltage, wherein the VCO is to adjust a frequency of the output oscillation signal in response to the voltage, to generate the second signal in response to the input oscillation signal, and to generate the first signal in response to the output oscillation signal, wherein the VCO comprises:
an oscillator circuit to generate the output oscillation signal, and including a node associated with an internal oscillation signal;
a synchronization logic to selectively align a phase of the output oscillation signal with a phase of the input oscillation signal in response to a synchronization signal; and
a control circuit to generate the synchronization signal in response to a detection of a predetermined number of cycles of the output oscillation signal.

18. The DLL circuit of claim 17, further comprising:
a loop filter coupled to an output of the charge pump, wherein the charge pump generating the voltage comprises:
the charge pump generating a charge to the output of the charge pump, and
the loop filter generating the voltage in response to receiving the charge from the charge pump.

19. The DLL circuit of claim 17, wherein the frequency of the output oscillation signal comprises an integer multiple of a frequency of the input oscillation signal.

20. The DLL circuit of claim 17, wherein:
during a normal oscillation phase, the VCO is to generate the output oscillation signal as having a frequency equal to an integer multiple of a frequency of the input oscillation signal; and
during a synchronization phase, the VCO is to align a selected edge of the output oscillation signal with a selected edge of the input oscillation signal.

21. The DLL circuit of claim 17, wherein the phase detector is to assert the first control signal in response to the first signal, assert the second control signal in response to the second signal, and de-assert the first control signal and the second control signal upon asserting both the first control signal and the second control signal.

22. The DLL circuit of claim 17, wherein the oscillator circuit comprises:
a latch including a first input, a second input, a first output, and a second output;
a first delay element coupled between the first output and the first input of the latch; and
a second delay element coupled between the second output and the second input of the latch.

23. The DLL circuit of claim 22, wherein one of the first delay element and the second delay element is a programmable delay element that is programmable in response to the voltage.

24. The DLL circuit of claim 23, wherein the programmable delay element comprises:
a configurable charging circuit to adjust a charging current provided to a charging node in response to one or more first enable signals; and
a configurable capacitor to adjust a capacitance coupled to the charging node in response to one or more second enable signals.

25. The DLL circuit of claim 17, wherein the synchronization logic comprises:
a multiplexer (MUX) including a first input to receive the internal oscillation signal, a second input to receive the input oscillation signal, an output to provide the output oscillation signal, and a control terminal to receive the synchronization signal.

26. The DLL circuit of claim 25, wherein the synchronization logic further comprises:
a first logic gate including inputs to receive the internal oscillation signal and the synchronization signal, and including an output to generate the first signal; and
a second logic gate including inputs to receive the input oscillation signal and the synchronization signal, and including an output to generate the second signal.

27. The DLL circuit of claim 17, wherein the VCO further comprises an acquisition logic coupled to the synchronization logic and the oscillator circuit, the acquisition logic:
including inputs to receive the input oscillation signal and the synchronization signal; and
to bypass the alignment by the synchronization logic if an edge of the input oscillation signal is received before the synchronization signal.

28. The DLL circuit of claim 17, wherein if an edge of the input oscillation signal is received before the synchronization signal, the acquisition logic is to further place and maintain the VCO in a reset state.

29. The DLL circuit of claim 17, wherein if an edge of the input oscillation signal is received before the synchronization signal, in response to receiving a subsequent edge of the input oscillation signal, the acquisition logic is to remove the VCO from a reset state by allowing the subsequent edge of the input oscillation signal to be provided to the oscillator circuit.

30. A delay-locked loop (DLL) circuit, comprising:
a phase detector to generate a first control signal and a second control signal in response to a comparison between a first signal and a second signal;
a charge pump, coupled to the phase detector, to generate a voltage in response to the first and second control signals; and
a voltage-controlled oscillator (VCO), comprising:
an oscillator circuit to adjust a frequency of an output oscillation signal in response to the voltage;
a synchronization logic to selectively align a phase of the output oscillation signal with a phase of an input oscillation signal in response to a synchronization signal; and
a control circuit to generate the synchronization signal in response to a detection of a predetermined number of cycles of the output oscillation signal.

31. The DLL circuit of claim 30, further comprising:
a loop filter coupled to an output of the charge pump, wherein the charge pump generating the voltage comprises:
the charge pump generating a charge to the output of the charge pump, and
the loop filter generating the voltage in response to receiving the charge from the charge pump.

32. The DLL circuit of claim 30, wherein the synchronization logic is to assert the second signal in response to an edge of the input oscillation signal, and to assert the first signal in response to an edge of the output oscillation signal.

33. The DLL circuit of claim 30, wherein the phase detector is to assert the first control signal in response to the first signal, assert the second control signal in response to the second signal, and de-assert the first control signal and the second control signal upon asserting both the first control signal and the second control signal.

34. The DLL circuit of claim 30, wherein the oscillator circuit comprises:
a latch including a first input, a second input, a first output, and a second output;
a first delay element coupled between the first output and the first input of the latch; and
a second delay element coupled between the second output and the second input of the latch.

35. The DLL circuit of claim 34, wherein one of the first delay element and the second delay element is a programmable delay element that is programmable in response to the voltage.

36. The DLL circuit of claim 35, wherein the programmable delay element comprises:
a configurable charging circuit to adjust a charging current provided to a charging node in response to one or more first enable signals; and
a configurable capacitor to adjust a capacitance coupled to the charging node in response to one or more second enable signals.

37. The DLL circuit of claim 35, wherein the synchronization logic comprises:
a multiplexer (MUX) including a first input to receive an internal oscillation signal from the first output of the latch, a second input to receive the input oscillation signal, an output to provide the output oscillation signal, and a control terminal to receive the synchronization signal;
a first logic gate including inputs to receive the internal oscillation signal and the synchronization signal, and including an output to generate the first signal; and
a second logic gate including inputs to receive the input oscillation signal and the synchronization signal, and including an output to generate the second signal.

* * * * *